(12) United States Patent
Ling

(10) Patent No.: US 6,368,762 B1
(45) Date of Patent: Apr. 9, 2002

(54) ACTIVE MASK EXPOSURE COMPENSATION OF UNDERLYING NITRIDE THICKNESS VARIATION TO REDUCE CRITICAL DIMENSION (CD) VARIATION

(75) Inventor: Zicheng Gary Ling, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/667,573

(22) Filed: Sep. 22, 2000

Related U.S. Application Data

(60) Provisional application No. 60/155,563, filed on Sep. 24, 1999.

(51) Int. Cl.$^7$ ................................ G03F 9/00; G03C 5/00
(52) U.S. Cl. .......................... 430/30; 430/311; 430/312; 430/394
(58) Field of Search ........................... 430/30, 311, 312, 430/394

(56) References Cited

U.S. PATENT DOCUMENTS 5,677,111 A  * 10/1997  Ogawa ........................ 430/512
5,733,712 A  *  3/1998  Tanaka et al. ............... 430/512

* cited by examiner

Primary Examiner—Christopher G. Young

(57) ABSTRACT

The CD variation of semiconductor devices on a wafer due to the variation in thickness of the underlying nitride layer is corrected by varying the lithographic exposure level as a function of the nitride layer thickness. Embodiments include decreasing the exposure level in areas where the nitride layer is relatively thicker.

10 Claims, 3 Drawing Sheets

ACTIVE MASK EXPOSURE COMPENSATION OF UNDERLYING NITRIDE THICKNESS VARIATION TO REDUCE CRITICAL DIMENSION (CD) VARIATION

RELATED APPLICATIONS

This application claims priority from U.S. Provisional Patent Application Ser. No. 60/155,563, filed on Sep. 24, 1999 entitled: "Active Mask Exposure Compensation of Underlying Nitride Thickness Variation to Reduce Critical Dimension (CD) Variation", the entire disclosure of which is hereby incorporated by reference therein.

FIELD OF THE INVENTION

The present invention relates to a method of manufacturing semiconductor devices, and is particularly useful in manufacturing high density semiconductor devices with submicron design features and active regions isolated by shallow, insulated trenches. The invention is particularly applicable in manufacturing semiconductor devices having features in the deep submicron range with reduced critical dimension.

BACKGROUND OF THE INVENTION

Conventional semiconductor devices comprise a substrate having various electrically isolated regions, called active regions, in which individual circuit components are formed. The electrical isolation of these active regions is typically accomplished by thermal oxidation of the semiconductor substrate, typically monocrystalline silicon or an epitaxial layer formed thereon, forming the active regions.

One type of isolation structure is known as trench isolation, wherein shallow trenches are etched in the substrate and an oxide liner is thermally grown on the trench walls. The trench is then filled with an insulating material. The resulting structure is referred to as a shallow trench isolation (STI) structure. The active regions typically comprise source/drain regions formed in the semiconductor substrate by implantation of impurities, spaced apart by a channel region on which a gate electrode is formed with a gate oxide layer therebetween. The gate electrode controls the turn-on and turn-off of each circuit component.

A typical method of trench formation comprises initially growing a pad oxide layer on the substrate, and depositing a nitride, e.g., silicon nitride, polish stop layer thereon. A photoresist mask is then applied to the nitride layer, and a pattern defining the trench areas is formed in the photoresist mask. This is accomplished by a photolithographic process in which selected areas of the photoresist are exposed to light and thereafter developed to form apertures extending to and exposing portions of the underlying nitride layer. The exposed portions of the nitride layer are etched away, followed by the pad oxide layer. The etching continues into the substrate to form the shallow trench. When etching of the trench is completed, the photoresist is stripped from the nitride layer.

Next, the substrate is oxidized to form an oxide liner on the walls and base of the trench to control silicon-silicon oxide interface quality. The trench is then filled with an insulating material (or "trench fill"), such as silicon dioxide derived from tetraethylorthosilicate (TEOS). The surface is then planarized, as by chemical-mechanical polishing (CMP) using the nitride layer as a polish stop, and the remaining nitride and pad oxide are stripped off from the active areas to complete the trench isolation structure.

As used herein, the term "critical dimension" or "CD" means the smallest permissible distance between two adjacent apertures on a photoresist mask. Since the features on the semiconductor device are formed by etching through the photoresist apertures and the nitride layer, CD also refers to the smallest permissible distance between such features. The critical dimension is a function of the precision in manufacturing the semiconductor device. The less control over aperture dimension in the photoresist, the greater the CD needed to prevent defects in the subsequently etched features on the semiconductor device.

The photoresist mask requires printing dense and isolated resist islands, as well as 0.25 micron or smaller isolated spaces and isolated lines on the silicon nitride layer, which is typically transparent $Si_3N_4$. The transparency of $Si_3N_4$ is problematic as light penetrating through the nitride layer during the lithographic process is reflected back at various angles to the photoresist layer. This increases the area of the photoresist exposed to light, resulting in a larger exposed area on the nitride layer after the photoresist is developed. Normally, the exposure level can be adjusted to account for a constant reflectivity level from the nitride layer. However, due to its refractive index mismatch with the photoresist and the silicon wafer substrate, the nitride layer thickness has a large effect on the reflectivity of the substrate. Thus, small thickness variations in the nitride layer result in a large "swing effect", defined as the change in critical dimension (CD) as a function of nitride layer thickness. This is illustrated by FIGS. 1 and 2. FIG. 1 shows the calculated reflectivity of the $Si_3N_4$ substrate versus $Si_3N_4$ thickness. FIG. 2 shows the measured swing effect (both reflectivity and CD) on a 1500 Å thick $Si_3N_4$ film. Due to this large reflectivity and CD swing effect, the normal small variations in resist thickness that occur in manufacturing give rise to large, unpredictable changes in source/drain mass (SDM) CD.

These changes in CD are illustrated in FIGS. 3–6. As shown in FIG. 3, the silicon substrate 10 is provided with a nitride layer 12 by deposition in a furnace. A photoresist layer 14 is applied over the nitride layer 12 via spin coat or other process. The photoresist layer is then exposed with a stepper via a reticle field or mask and then developed to form a pattern represented by apertures 16, 18, and 20. The nitride layer is then etched to form apertures 22, 24, and 26, followed by etching of the silicon layer 10 to form trenches 28, 30, and 32, which are then filled with an oxide 34. The excess oxide is then removed via planarization, with the nitride layer 12 acting as a polish stop.

As shown in FIGS. 3–5, the nitride layer 12 does not have a uniform thickness. During the lithographic process, in which the photoresist is exposed to light to form the trench pattern, some of the light penetrates to and through the nitride layer and is reflected back. The greater the thickness of the nitride layer, the greater the amount of reflectivity, and the greater the exposed area of the photoresist for a given exposure by the reticle. Due to the nonuniformity of the nitride layer, the correct exposure level to obtain a specified CD will vary at different locations on the photoresist, and hence a constant exposure level will produce large variations in the width of the trenches, which can lead to bridging.

One approach to the problem of CD variation has been the use of organic bottom anti-reflective coatings (organic BARCs). However, the use of organic BARCs creates other problems, for example, higher level of defects, nonconformal coating over topography, and increased dense-to-isolated and line/space bias due to the BARC etching process. Moreover, the application of organic BARCs requires an extra step to apply the coating.

There is accordingly a need in the art for a method for providing a STI mask which will result in a more uniform trench dimension and hence will provide a critical dimension of less than 0.25 microns.

SUMMARY OF THE INVENTION

An advantage of the present invention is a method for manufacturing a semiconductor device which allows more concise control of critical dimension. Another advantage of the present invention is a method for manufacturing a semiconductor device, as above, which will allow a critical dimension of 0.25 microns or less. Yet another advantage of the present invention is a method of manufacturing a semiconductor device, as above, which does not require the application of additional layers to the wafer.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a method for reducing critical dimension variation in a photoresist layer contained in a semiconductor composite. The composite includes a silicon nitride layer formed on a major surface of a silicon wafer, and a photoresist layer formed on the silicon nitride layer. The method provides for selection of an exposure level for the lithographic process for exposing a portion of the composite, the level of exposure being selected based on the reflectance of the silicon nitride layer in the particular portion. The photoresist layer in the portion is then exposed at the selected exposure level in accordance with a pattern, thereby forming at least one exposed area and at least one unexposed area. This process is repeated for different portions of the composite having different nitride layer thickness, and for each portion, a different lithographic exposure level may be selected based on the calculated or measured reflectivity of the nitride layer in that portion.

After the entire composite has been exposed, it is developed to form apertures in the photoresist having a substantially uniform critical dimension across the entire photoresist. The nitride layer and the silicon wafer are then etched in well-known manner, the low CD of the photoresist carrying through to formation of the STI structure in the silicon wafer substrate.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE DRAWINGS

Reference is made to the attached drawings, wherein elements having the same reference numeral designations represent like elements throughout, and wherein.

DETAILED DESCRIPTION OF THE INVENTION

Figure 1:
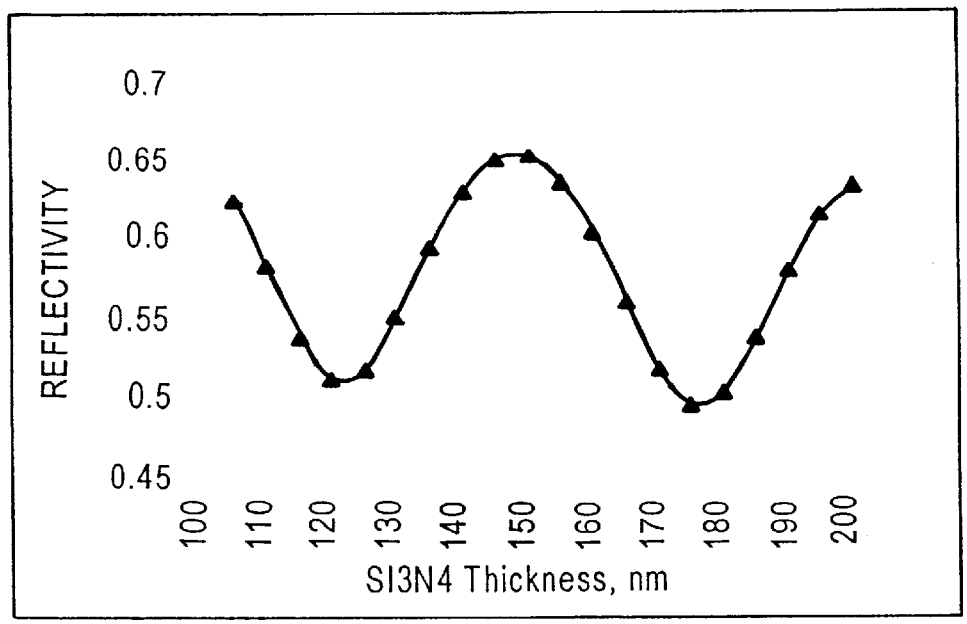
FIG. 1 is a graph of calculated reflectivity at a wavelength of 248 nm of an $Si_3N_4$ STI substrate as a function of thickness.
Figure 2:
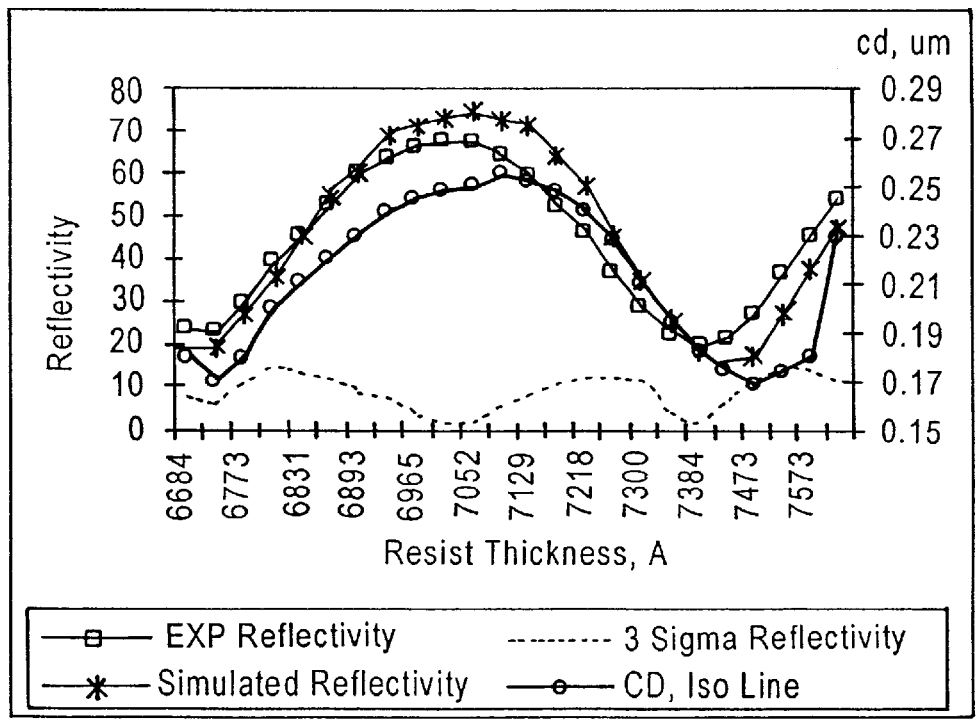
FIG. 2 is a graph of reflectivity at 248 nm of a resist-coated $Si_3N_4$ STI substrate plotted with measured CD of a 0.27 μm nominal SDM isolated line.
Figure 3:
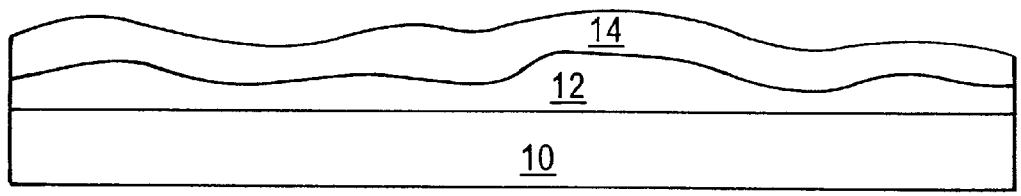
FIGS. 3–6 schematically illustrate sequential phases of a method of STI formation.
Figure 4:
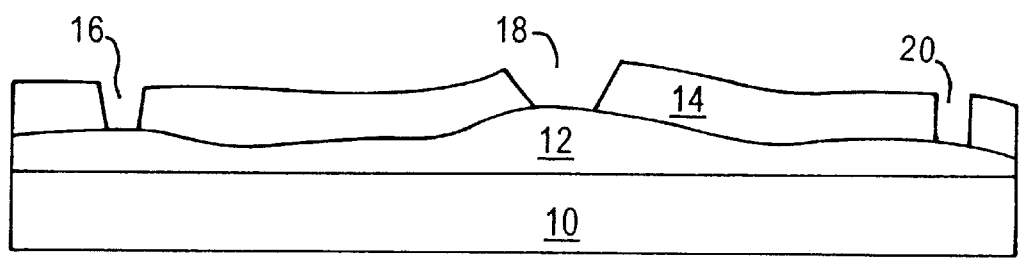
Figure 5:
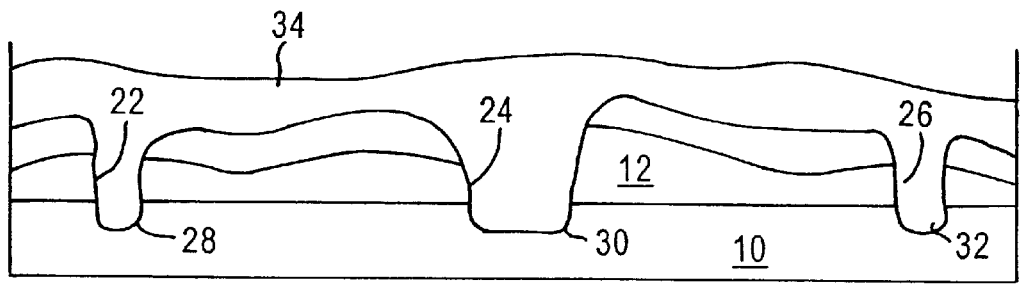
Figure 6:

The present invention addresses and solves the problem of CD variation due to variation in nitride layer thickness. Such variations in CD adversely affect the ability of conventional photolithographic techniques to form features with fine dimensions; e.g., less than about 0.25 Å, particularly less than about 0.18 Å. The present invention enables the manufacture of semiconductor devices with consistently low CD, for example 0.18 Å or even as low as 0.12 Å, which allows very dense features on the device.

According to the methodology of the present invention, a nitride polish stop layer having a variable thickness is formed on a pad oxide layer, which, in turn, is formed on a major surface of a semiconductor substrate or an epitaxial layer on a semiconductor substrate. As used throughout the present disclosure and claims, the term "substrate" denotes a semiconductor substrate or an epitaxial layer formed on the semiconductor substrate.

The nitride polish layer can be formed using chemical vapor deposition (CVD), in which a nitrogen-containing gas is reacted with the silicon substrate to form a silicon nitride layer. In this process, a silicon wafer is heated in a furnace, and a nitrogen-containing gas stream is passed through the furnace. The gas reacts with the silicon to form a silicon-nitride layer. In place of CVD, other well-known techniques can be used to form a silicon nitride layer.

The silicon-nitride layer so formed is from about 300 Å to about 2500 Å in thickness, desirably from about 800 Å to about 2000 Å and in preferred embodiments is from about 1200 Å to about 1800 Å. The thickness variation can be from as low as ±1% to as high as ±20% or even greater. The actual variation in nitride layer thickness is a function of manufacturing conditions. Hence, for a typical nitride layer of 1500 Å average thickness, the actual thickness at a given point can vary from as little as between 1485 Å and 1515 Å and as much as between 1200 Å and 1800 Å or even greater. Generally, the thickness variation is random for each silicon wafer.

In the process of the invention, the photolithographic step employed to create the resist compensates for reflectance variation of the underlying nitride layer due to variations in thickness. A key parameter determining reflectance is optical path length, which denotes the thickness of a material at a given wavelength of light; i.e., how thick the layer on which the source/drain mask (nitride layer) is formed appears at the wavelength at which the photolithographic process is conducted. Optical path length is a product of a material's refractive index and its thickness, and the optical path lengths of materials stacked on one another can be summed to obtain a total optical path length.

Generally, a stepper is used to expose the photoresist, wherein portions of the photoresist on the wafer are exposed in sequence. In accordance with the present invention, the exposure level of the stepper is controlled as a function of the reflectance of the silicon nitride layer. As discussed earlier, the reflectance of the silicon nitride layer is directly related to its thickness, such that as thickness increases, reflectance increases. In a preferred embodiment of the invention, the exposure time of the stepper light is varied to compensate for the variation in reflectance across the composite structure.

In a preferred technique for determining exposure level, the composite is "mapped" for reflectivity of the silicon nitride layer prior to the photolithography step. This can be accomplished in a number of ways, for example, usage of an interferometer to measure phase shift of reflected light, which provides an indirect measurement of nitride layer thickness. In this method, the amount of reflectivity for a given silicon-nitride layer thickness is known via experimental determination, and from this a reflectivity value is assigned to the silicon-nitride layer having the measured thickness. In another method, an ellipsometer is used to measure the angle of reflectance of a beam of light and from this a thickness is determined. Reflectivity is then assigned as above from previous experimental determination.

Once reflectivity values are assigned to the entire composite, the stepper can be programmed to vary the "dwell" or residence time in a particular area of the composite as a function of the assigned reflectivity for that area. Software and circuitry to accomplish this are well known to one of ordinary skill in the art. Although varying the dwell time is the preferred method of varying exposure, it is also possible to vary exposure via change of the intensity of the light. Typically, the dwell time is a function of the light intensity, but in general can vary from about $1/10,000$ to about $1/30$ sec.

Different areas of the composite are then exposed by movement of the stepper or composite, with adjustments made in the exposure level depending on the assigned reflectivity. Depending on the randomness of the thickness variation, the stepper may perform from one to ten or even more exposures at a given exposure level. After the photolithographic process is completed, the composite is developed and further processed in known manner to produce the desired fine-dimensioned features.

Figure 7:
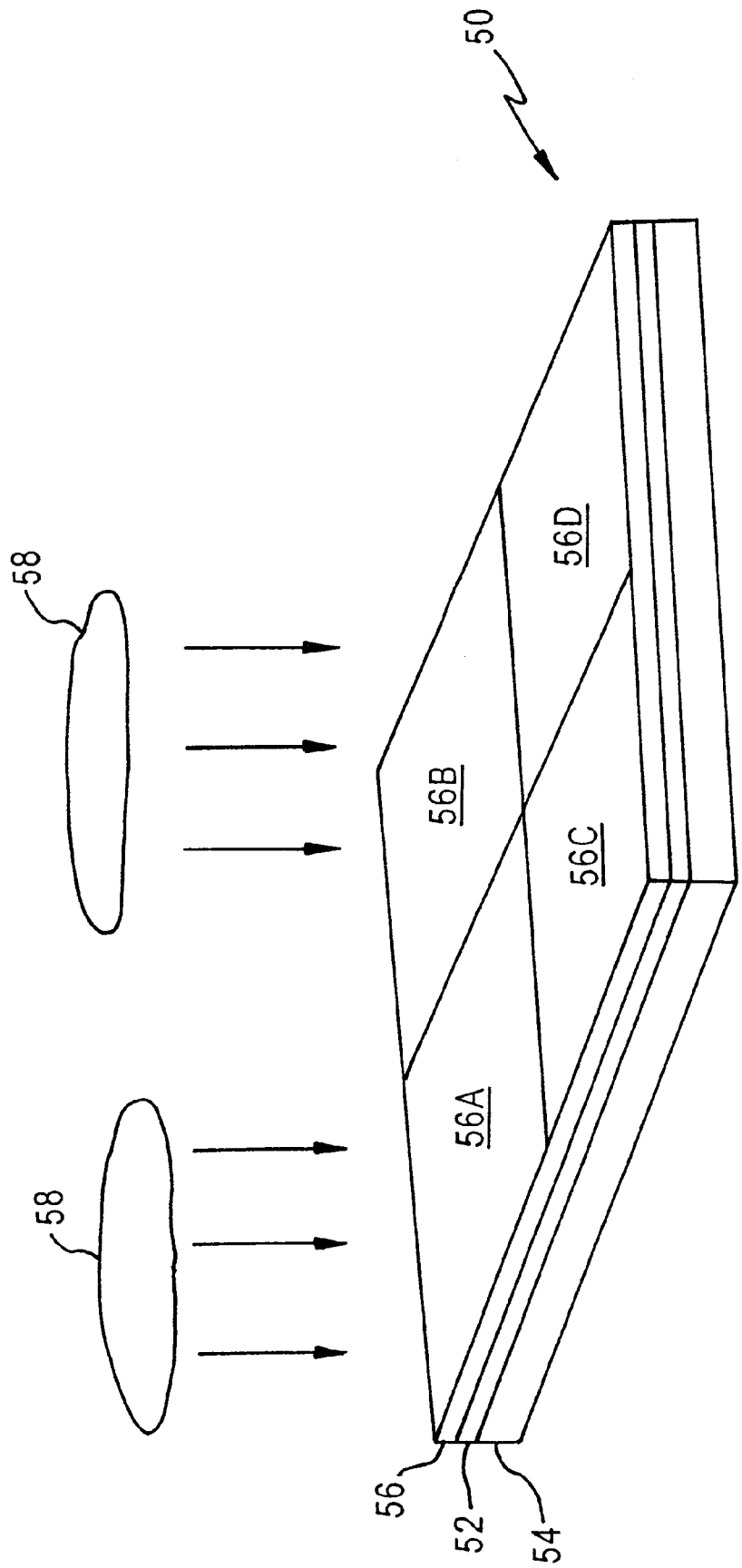
FIG. 7 is an illustration of a lithographic exposure of a portion of a composite according to the present invention.

The step of exposing the composite with a varying amount of light is illustrated in FIG. 7, wherein a composite is indicated generally by the number 50. A silicon nitride layer 52 is located above a silicon substrate 54. Atop the nitride layer 52 is a photoresist layer 56. The photoresist layer 56 is divided for purposes of example into from areas 56A through 56D. In actual production, the number of regions could be much greater; e.g., from about 4 to about 20 regions. For each area 56A–D, a stepper 58 provides a preset level of light exposure as a function of the reflectivity of the silicon nitride layer 52. For example, the exposure level, as measured by time and intensity, might be less for exposure of area 56A than for area 56B because of the higher thickness and hence higher reflectivity of the silicon nitride layer 52 in area 56A than in area 56B.

Thus, by utilizing the methodology of the present invention, CD variation of semiconductor devices on a wafer due to the variation in thickness of the underlying nitride layer is corrected by varying the lithographic exposure level as a function of the nitride layer thickness.

The present invention is applicable to the manufacture of various types of semiconductor devices, particularly high-density semiconductor devices having a design rule of about 0.25 micron and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device having reduced critical dimension variation of a feature, the method comprising the steps of:

(a) forming a silicon nitride layer with variable thickness on a surface to be patterned;

(b) applying a photoresist layer on the silicon nitride layer;

(c) selecting a lithographic exposure level for exposing a portion of the photoresist layer in the composite, the exposure level selected based on the reflectance of the silicon nitride layer in said portion of said composite;

(d) exposing the photoresist layer in said portion at the selected exposure level and in accordance with an exposure pattern, thereby forming at least one exposed area and at least one unexposed area on said portion of the photoresist layer;

(e) repeating steps (c) and (d) for different portions of the photoresist layer; and (f) developing the exposed areas in the photoresist, thereby forming features in the surface having a substantially uniform critical dimension, defined as the minimum spacing between features.

2. The method as claimed in claim 1 comprising:

measuring the thickness of the silicon nitride layer;

determining the reflective level in response to the measured thickness; and determining the selected exposure level in response to the determined reflective level.

3. A method as claimed in claim 1, wherein the silicon nitride layer has a thickness of about 300 Å to about 2500 Å.

4. A method as claimed in claim 1, wherein the number of separately exposed portions on the exposing step (d) is from about 4 to about 20.

5. A method as claimed in claim 1, wherein from about 1 to about 10 exposures are made per exposure level.

6. The method as claimed in claim 1, wherein the exposure level in the exposing step (d) is based on exposure time.

7. The method as claimed in claim 1 wherein the exposure time is from about $1/10,000$ second to about $1/30$ second.

8. The method as claimed in claim 1, wherein the critical dimension of the developed photoresist in step (f) is less than about 0.25 micron.

9. The method as claimed in claim 1, wherein the critical dimension of the developed photoresist in step (f) is less than about 0.15 micron.

10. The method as claimed in claim 1, wherein the critical dimension of the developed photoresist in step (f) is less than about $0.12\mu$ or less.

* * * * *